(12) United States Patent
Watanabe et al.

(10) Patent No.: US 8,735,299 B2
(45) Date of Patent: May 27, 2014

(54) SEMICONDUCTOR DEVICE MANUFACTURING METHOD AND COMPUTER-READABLE STORAGE MEDIUM

(75) Inventors: Seiichi Watanabe, Boise, ID (US); Manabu Sato, Miyagi (JP); Kazuki Narishige, Yamanashi (JP); Takanori Sato, Miyagi (JP); Takayuki Katsunuma, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 54 days.

(21) Appl. No.: 13/410,512

(22) Filed: Mar. 2, 2012

(65) Prior Publication Data

US 2012/0225561 A1   Sep. 6, 2012

Related U.S. Application Data

(60) Provisional application No. 61/466,192, filed on Mar. 22, 2011.

(30) Foreign Application Priority Data

Mar. 3, 2011 (JP) .................. 2011-046772
Feb. 20, 2012 (JP) .................. 2012-033954

(51) Int. Cl.
*H01L 21/302* (2006.01)

(52) U.S. Cl.
USPC ........... 438/725; 438/634; 438/642; 438/761; 216/83

(58) Field of Classification Search
USPC ............. 438/725, 634, 642, 760, 761; 216/83
See application file for complete search history.

(56) References Cited

U.S. PATENT DOCUMENTS

| | | | | |
|---|---|---|---|---|
| 6,069,069 A | * | 5/2000 | Chooi et al. | 438/634 |
| 6,967,408 B1 | * | 11/2005 | Ko | 257/774 |
| 7,550,390 B2 | * | 6/2009 | Lee et al. | 438/710 |
| 7,700,492 B2 | * | 4/2010 | Kikuchi | 438/706 |
| 7,786,020 B1 | | 8/2010 | Kang et al. | |

FOREIGN PATENT DOCUMENTS

| | | | |
|---|---|---|---|
| JP | 2009-170661 | * | 1/2008 |
| JP | 2009-170661 A | | 7/2009 |

* cited by examiner

*Primary Examiner* — Nadine Norton
*Assistant Examiner* — Maki Angadi
(74) *Attorney, Agent, or Firm* — Pearne & Gordon LLP

(57) ABSTRACT

There is provided a semiconductor device manufacturing method for forming a step-shaped structure in a substrate by etching the substrate having thereon a multilayer film and a photoresist film on the multilayer film and serving as an etching mask. The multilayer film is formed by alternately layering a first film having a first permittivity and a second film having a second permittivity different from the first permittivity. The method includes a first process for plasma-etching the first film by using the photoresist film as a mask; a second process for exposing the photoresist film to hydrogen-containing plasma; a third process for trimming the photoresist film; and a fourth process for etching the second film by using the trimmed photoresist film and the plasma-etched first film as a mask. The step-shaped structure is formed in the multilayer film by repeatedly performing the first process to the fourth process in this sequence.

9 Claims, 4 Drawing Sheets

SEMICONDUCTOR DEVICE MANUFACTURING METHOD AND COMPUTER-READABLE STORAGE MEDIUM

CROSS-REFERENCE TO RELATED APPLICATION

This application claims the benefit of Japanese Patent Application Nos. 2011-046772 and 2012-033954 filed on Mar. 3, 2011 and Feb. 20, 2012, respectively, and U.S. Provisional Application Ser. No. 61/466,192 filed on Mar. 22, 2011, the entire disclosure of which are incorporated herein by reference.

FIELD OF THE INVENTION

The present disclosure relates to a semiconductor device manufacturing method and a computer-readable storage medium.

BACKGROUND OF THE INVENTION

Conventionally, in a semiconductor device manufacturing process, various plasma processes such as an etching process and a film forming process are performed on a substrate such as a semiconductor wafer by using plasma. In such a semiconductor device manufacturing process, e.g., in a manufacturing process of a NAND type flash memory, it has been known to form a step-shaped structure by performing a plasma etching process and a mask trimming process on a multilayer film that has two kinds of films each having a different permittivity. As the multilayer film, for example, an insulating film and a conductive film are alternately layered (see, for example, Patent Document 1).

Patent Document 1: Japanese Patent Laid-open Publication No. 2009-170661

However, in the aforementioned semiconductor device manufacturing process for forming the step-shaped structure in the multilayer film formed by alternately layering two kinds of layers each having a different permittivity, for example, an insulating film and a conductive film, since the number of processes that need to be performed is great, manufacturing efficiency is deteriorated. Further, it has been difficult to appropriately form a good step-shaped structure having multiple step-shaped portions due to deposits or the like.

BRIEF SUMMARY OF THE INVENTION

In view of the foregoing problems, illustrative embodiments provide a semiconductor device manufacturing method capable of efficiently forming a good step-shaped structure having multiple step-shaped portions and also provide a computer-readable storage medium.

In accordance with an aspect of an illustrative embodiment, there is provided a semiconductor device manufacturing method for forming a step-shaped structure in a substrate by etching the substrate having thereon a multilayer film and a photoresist film provided on the multilayer film and serving as an etching mask. The multilayer film is formed by alternately layering a first film having a first permittivity and a second film having a second permittivity different from the first permittivity. The semiconductor device manufacturing method includes a first process for plasma-etching the first film by using the photoresist film as a mask; a second process for exposing the photoresist film to hydrogen-containing plasma; a third process for trimming the photoresist film; and a fourth process for etching the second film by using the trimmed photoresist film and the plasma-etched first film as a mask. Here, the step-shaped structure may be formed in the multilayer film by repeatedly performing the first process to the fourth process in this sequence.

In accordance with an illustrative embodiment, it is possible to efficiently forming a step-shaped structure having multiple step-shaped portions.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Figure 1:
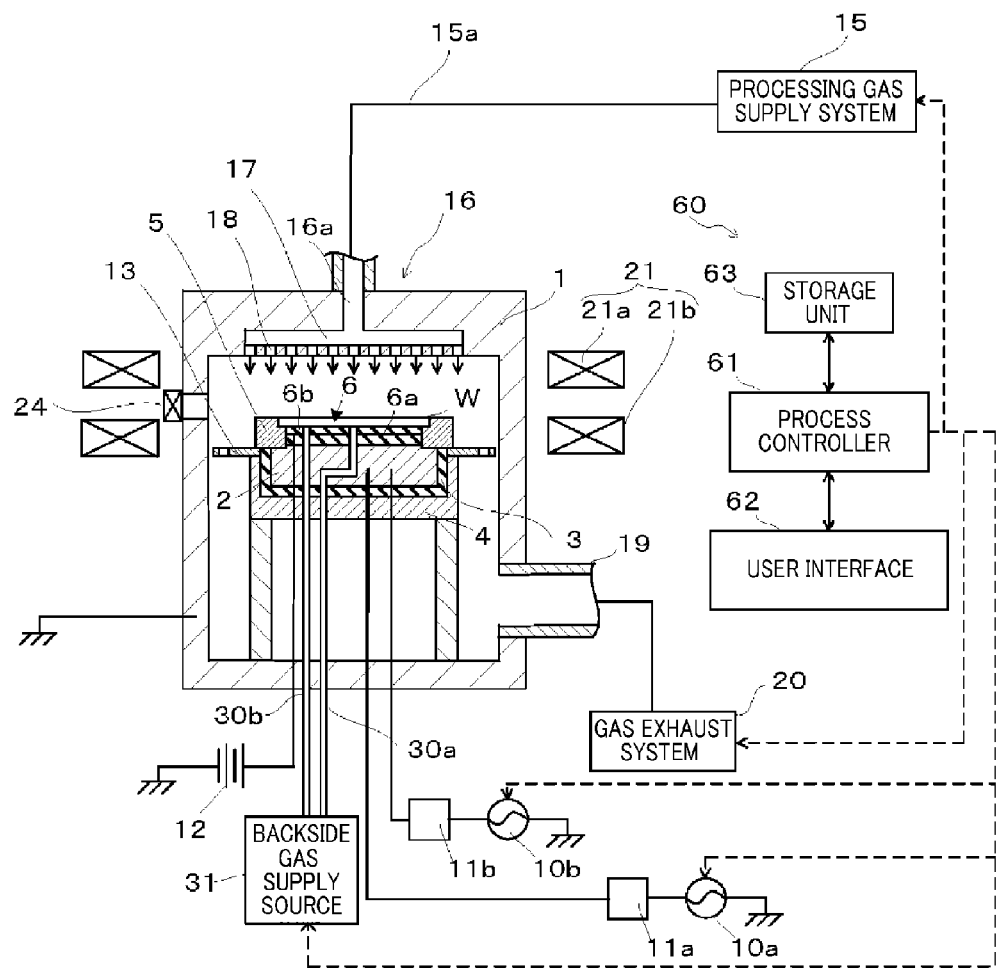
FIG. 1 is a cross sectional view schematically illustrating a plasma processing apparatus used in a semiconductor device manufacturing method in accordance with an illustrative embodiment.

Hereinafter, illustrative embodiments will be described with reference to the accompanying drawings. FIG. 1 is a cross sectional view schematically illustrating a configuration of a plasma processing apparatus used in a semiconductor device manufacturing method in accordance with an illustrative embodiment. The plasma processing apparatus includes a processing chamber 1 that is hermetically sealed and electrically grounded.

The processing chamber 1 has a cylindrical shape and is made of, but not limited to, aluminum whose surface is coated with an anodic oxidized film. A mounting table 2 for horizontally mounting thereon a semiconductor wafer W as a processing target substrate is provided within the processing chamber 1. The mounting table 2 serves as a lower electrode and is made of a conductive material such as aluminum. The mounting table 2 is supported on a conductive support 4 via an insulating plate 3. Further, a circular ring-shaped focus ring 5 is placed on an upper periphery of the mounting table 2 so as to surround the semiconductor wafer W.

The mounting table 2 is connected with a first high frequency power supply 10a via a first matching box 11a and also connected with a second high frequency power supply 10b via a second matching box 11b. A high frequency power of a certain frequency (e.g., about 100 MHz) is supplied from the first high frequency power supply 10a to the mounting table 2. Meanwhile, a high frequency power of a certain frequency (e.g., about 13.56 MHz) lower than the frequency of the first high frequency power supply 10a is supplied from the second high frequency power supply 10b to the mounting table 2.

A shower head 16 is disposed above the mounting table so as to face the mounting table 2 in parallel. The shower head 16 is electrically grounded. Accordingly, the shower head 16 and the mounting table 2 serve as a pair of facing electrodes (upper electrode and lower electrode, respectively).

An electrostatic chuck 6 for electrostatically attracting and holding the semiconductor wafer W is provided on a top surface of the mounting table 2. The electrostatic chuck 6 includes an electrode 6a embedded in an insulator 6b, and the electrode 6a is connected with a DC power supply 12. The semiconductor wafer W is attracted to and held on the electrostatic chuck 6 by a Coulomb force generated by applying a DC voltage to the electrode 6a from the DC power supply 12.

A non-illustrated coolant path is formed within the mounting table 2. By circulating a coolant through the coolant path, a temperature of the mounting table 2 can be controlled. Further, backside gas supply pipes 30a and 30b for supplying a backside gas (backside heat transfer gas) such as a helium gas toward a rear side of the semiconductor wafer W are formed through the mounting table 2. The backside gas is supplied to the rear side of the semiconductor wafer W from a backside gas supply source 31. The backside gas supply pipe 30a supplies the backside gas to a central portion of the semiconductor wafer W, while the backside gas supply pipe 30b supplies the backside gas to a periphery portion of the semiconductor wafer W. With this configuration, the semiconductor wafer W can be controlled to a certain temperature. Further, a gas exhaust ring 13 is provided below an outer periphery of the focus ring 5. The gas exhaust ring 13 is electrically connected with the processing chamber 1 via the support 4.

The shower head 16 is placed at a ceiling wall of the processing chamber 1 so as to face the mounting table 2. A multiple number of gas discharge holes 18 are formed in a lower surface of the shower head 16. A gas inlet 16a is formed on an upper portion of the shower head 16, and a space 17 is formed within the shower head 16. The gas inlet 16a is connected with one end of a gas supply line 15a, and the other end of the gas supply line 15a is connected with a processing gas supply system 15 that supplies a gas (etching gas) for plasma etching or the like.

The gas supplied from the processing gas supply system 15 is introduced into the space 17 within the shower head 16 through the gas supply line 15a and the gas inlet 16a, and then is discharged toward the semiconductor wafer W through the gas discharge holes 18.

A gas exhaust port 19 is formed in a lower portion of the processing chamber 1, and a gas exhaust system 20 is connected to the gas exhaust port 19. By operating a vacuum pump included in the gas exhaust system 20, the inside of the processing chamber 1 can be depressurized to a certain vacuum level. Further, a gate valve 24 for opening and closing a loading/unloading port through which the semiconductor wafer W is transferred is provided at a sidewall of the processing chamber 1.

A ring magnet 21 is concentrically provided around the processing chamber 1. The ring magnet 21 includes an upper ring magnet 21a and a lower ring magnet 21b positioned below the upper ring magnet 21a. The ring magnet 21 generates a magnetic field in a space between the mounting table 2 and the shower head 16. The ring magnet 21 can be rotated by a rotating device such as a non-illustrated motor or the like.

The overall operation of the plasma processing apparatus configured as described above is controlled by a control unit 60. The control unit 60 includes a process controller 61 having a CPU, for controlling individual parts of the plasma processing apparatus; a user interface 62; and a storage unit 63.

The user interface 62 includes a keyboard through which a process manager inputs a command to manage the plasma processing apparatus, a display for visually displaying an operational status of the plasma processing apparatus, and so forth.

The storage unit 63 stores therein control programs (software) for implementing various processes performed in the plasma processing apparatus under the control of the process controller 61; and recipes including processing condition data and the like. In response to an instruction from the user interface 62 or the like, a necessary recipe is retrieved from the storage unit 63 and executed by the process controller 61, so that a desired process is performed in the plasma processing apparatus under the control of the process controller 61. The control programs and the recipes including the processing condition data can be read out from a computer-readable storage medium (e.g., a hard disk, a CD, a flexible disk, a semiconductor memory, or the like), or can be used on-line by being received from another apparatus through, e.g., a dedicated line, whenever necessary.

Now, a sequence for plasma-etching a semiconductor wafer W in the plasma processing apparatus having the above-described configuration will be explained. First, the gate valve 24 is opened, and the semiconductor wafer W is loaded into the processing chamber 1 via a non-illustrated load lock chamber by a non-illustrated transfer robot or the like, and the semiconductor wafer W is mounted on the mounting table 2. Then, the transfer robot is retreated out of the processing chamber 1, and the gate valve 24 is closed. Subsequently, the processing chamber 1 is evacuated through the gas exhaust port 19 by the vacuum pump of the gas exhaust system 20.

When the inside of the processing chamber 1 reaches a desired vacuum level, a processing gas is introduced into the processing chamber 1 from the processing gas supply system 15, and the inside of the processing chamber 1 is controlled to have a certain pressure, e.g., about 13.3 Pa (about 100 mTorr). In this state, high frequency powers are supplied to the mounting table 2 from the first and second high frequency power supplies 10a and 10b. At this time, a DC voltage is applied to the electrode 6a of the electrostatic chuck 6 from the DC power supply 12, so that the semiconductor wafer W is attracted to and held on the electrostatic chuck 6 by a Coulomb force or the like.

By applying the high frequency powers to the mounting table 2 serving as the lower electrode as described above, an electric field is formed between the shower head 16 serving as the upper electrode and the mounting table 2 serving as the lower electrode. Meanwhile, since a magnetic field is formed between the shower head 16 serving as the upper electrode and the mounting table 2 serving as the lower electrode by the ring magnet 21, a magnetron discharge is generated due to drift of electrons in a processing space in which the semiconductor wafer W exists. As a result of the magnetron discharge, the processing gas is excited into plasma, and a plasma process is performed on the semiconductor wafer W.

Upon the completion of the plasma process, the supply of the high frequency powers and the supply of the processing gas are stopped, and the semiconductor wafer W is unloaded from the processing chamber 1 in the reverse sequence to that described above.

Figure 2:
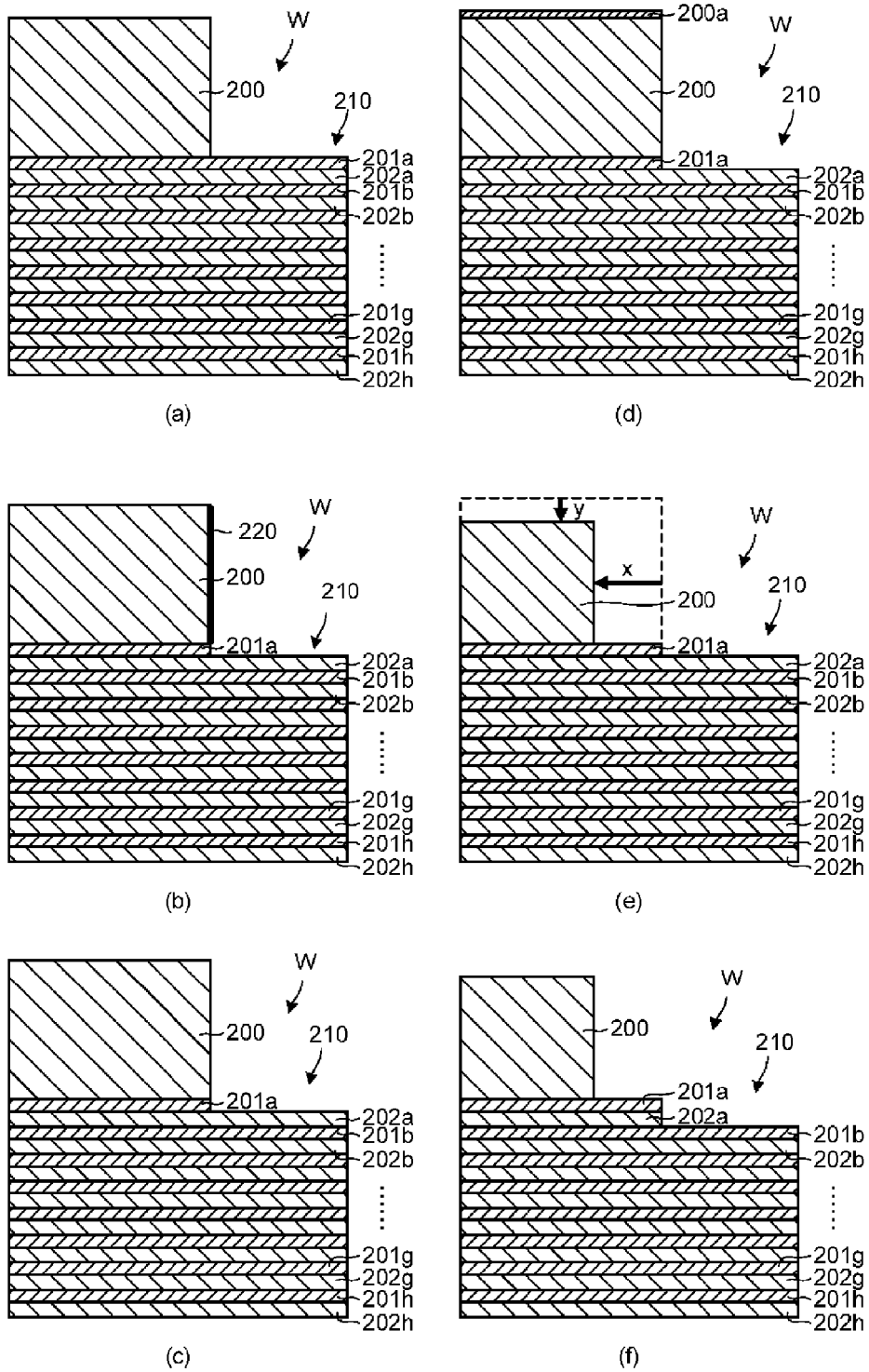
FIG. 2 provides cross sectional views schematically illustrating a structure of a semiconductor wafer in accordance with the illustrative embodiment.
Figure 3:
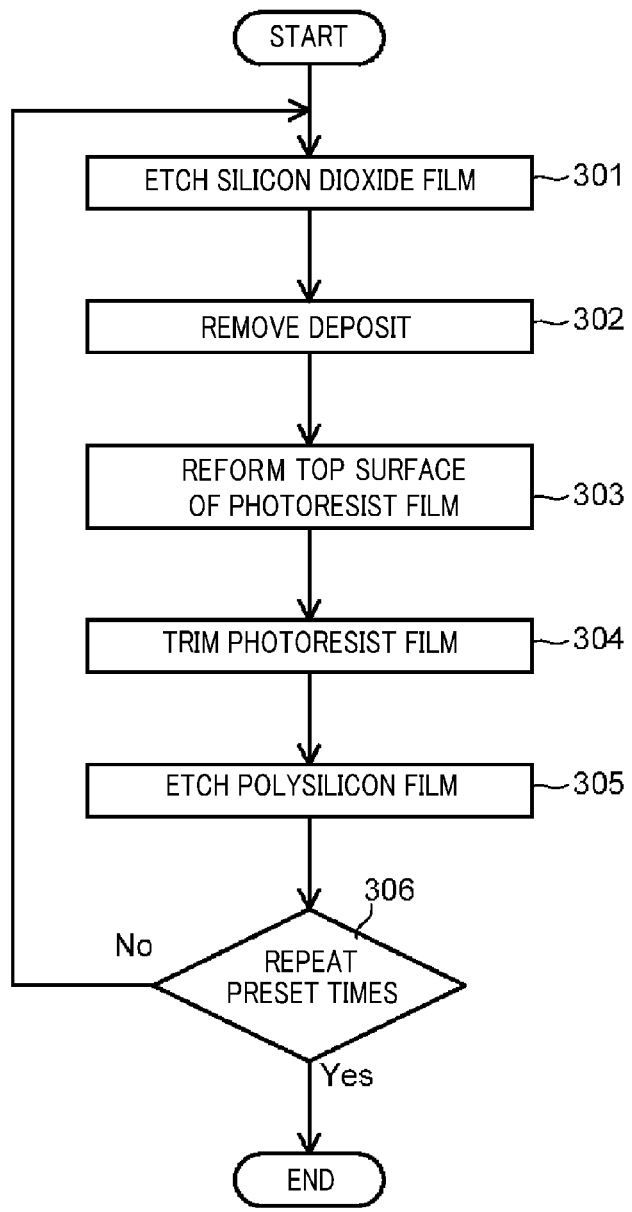
FIG. 3 is a flowchart for describing processes in accordance with the illustrative embodiment.

Now, a semiconductor device manufacturing method in accordance with an illustrative embodiment will be described with reference to FIGS. 2 and 3. FIG. 2 provides cross sectional views schematically showing a structure of a semiconductor wafer W as a processing target substrate, and FIG. 2 illustrates processes in accordance with the illustrative embodiment. FIG. 3 is a flowchart for describing a sequence of the processes in accordance with the illustrative embodiment.

As depicted in FIG. 2(a), a photoresist film 200 serving as a mask and having a pattern of a certain shape is formed at a topmost portion of the semiconductor wafer W. The photoresist film 200 has a thickness of, e.g., about 5 μm. A silicon dioxide ($SiO_2$) film 201a as an insulating film is formed under the photoresist film 200, and a polysilicon film (doped polysilicon film) 202a as a conductive film is formed under the silicon dioxide film 201a.

Further, a silicon dioxide film 201b is formed under the polysilicon film 202a, and a polysilicon film 202b is formed under the silicon dioxide film 201b. In this way, a multilayer film 210 is formed by alternately layering silicon dioxide films 201 (201a to 201h) and polysilicon films 202 (202a to 202h). By way of example, the multilayer film 210 is formed by forming a total number of 64 layers including 32 layers of silicon dioxide films 201 and 32 layers of polysilicon films 202.

Further, in the illustrative embodiment, the multilayer film is described to have the silicon dioxide ($SiO_2$) films and the polysilicon films (doped polysilicon films) alternately layered. However, the multilayer film may be formed by alternately layering first films each having a first permittivity and second films each having a second permittivity different from the first permittivity. To be more specific, the multilayer film may be formed by layering a silicon dioxide film and a silicon nitride film or by layering a polysilicon film and a doped polysilicon film.

From a state shown in FIG. 2(a), the silicon dioxide film 201a is plasma-etched by using the photoresist film 200 as a mask, so that a state shown in FIG. 2(b) is obtained (process 301 of FIG. 3). This plasma etching process is performed by using plasma of a processing gas such as, but not limited to, a gaseous mixture of a $CF_4$ gas and a $CHF_3$ gas.

Subsequently, by performing a deposit removing process for removing deposits generated by the plasma etching process, especially, deposits 220 deposited on a sidewall of the photoresist film 200, a state shown in FIG. 2(c) is obtained (process 302 of FIG. 3). This deposit removing process is performed by using plasma of a processing gas such as, but not limited to, a gaseous mixture of an $O_2$ gas and a $CF_4$ gas.

Then, by performing a reforming process (curing process) for reforming a top surface of the photoresist film 200, a reforming film 200a is formed on the top surface of the photoresist film 200, so that a state shown in FIG. 2(d) is obtained (process 303 of FIG. 3). This reforming process (curing process) is performed by exposing the photoresist film 200 to hydrogen-containing plasma.

Afterward, by performing a trimming (slimming) process of the photoresist film 200, an opening area of the photoresist film 200 is enlarged. That is, by exposing a part of the silicon dioxide film 201a under the photoresist film 200, a state shown in FIG. 2(e) is obtained (process 304 of FIG. 3). This trimming process is performed by using plasma of a processing gas such as, but not limited to, an $O_2$ gas and a $N_2$ gas.

Thereafter, the polysilicon film 202a under the silicon dioxide film 201a is plasma-etched by using the photoresist film 200 and the exposed part of the silicon dioxide film 201a as a mask, so that a state shown in FIG. 2(f) is obtained (process 305 of FIG. 3). This plasma etching process is performed by plasma of a processing gas such as, but not limited to, a gaseous mixture of a HBr gas, a $SF_6$ gas, and a He gas.

Through the above-described processes, a first step-shaped portion is formed. Thereafter, by repeatedly performing the aforementioned processes from the plasma etching process of the silicon dioxide film 201 to the plasma etching process of the polysilicon film 202 a preset number of times (process 306 of FIG. 3), a step-shaped structure having a certain number of step-shaped portions is formed.

As stated above, in accordance with the illustrative embodiment, the trimming process of the photoresist film 200 is performed just before performing the plasma etching process of the polysilicon film 202. If the trimming process is performed after performing the plasma etching process of the polysilicon film 202, since the amount of the deposits on the sidewall of the photoresist film 200 is increased right after performing the plasma etching process thereof, the trimming process of the photoresist film 200 may not be easily performed.

By way of example, if the trimming process of the photoresist film 200 is performed after plasma-etching the silicon dioxide film 201 and the polysilicon film 202 in sequence, the amount of the deposits on the sidewall of the photoresist film 200 is increased by the etching process of the polysilicon film 202. As a result, it is difficult to easily perform the trimming process of the photoresist film 200.

In contrast, as in the illustrative embodiment, by performing the trimming process of the photoresist film 200 right before performing the plasma etching process of the polysilicon film 202, a large trimming amount of the photoresist film 200 can be obtained more easily in a short period of time.

Further, when forming a next step-shaped portion of the step-shaped structure, like the first step-shaped portion, the plasma etching process of the silicon dioxide film 201 and the deposit removing process are performed after the completion of the plasma etching of the polysilicon film 202. Therefore, a large trimming amount of the photoresist film 200 can be obtained more easily in a short period of time.

In accordance with the illustrative embodiment, since the reforming process (quality modification process) for reforming the top surface of the photoresist film 200 is performed before the trimming process, a trimming amount of the top surface of the photoresist film 200 can be reduced during the trimming process. Accordingly, in the trimming process, a thickness decrement (y in FIG. 2(e)) of the photoresist film 200 can be suppressed, whereas a trimming amount (x in FIG. 2(e)) of the photoresist film 200 in a horizontal direction can be increased. Thus, a trimming ratio y/x can be a small value.

As an experimental example, the plasma processing apparatus having the configuration shown in FIG. 1 is used. Further, as illustrated in FIG. 2, a step-shaped structure is formed under the following processing conditions by performing a plasma process on a multilayer film in which silicon dioxide films as insulating films and polysilicon films as conductive films are alternately layered.

(Etching Process of Silicon Oxide Film)
  Processing gas: $CF_4/CHF_3$=about 175 sccm/about 25 sccm
  Pressure: about 16.0 Pa (about 120 mTorr)
  High frequency power (high frequency power/low frequency power): about 500 W/about 200 W (Removing Process of Deposits)
  Processing gas: $O_2/CF_4$=about 150 sccm/about 350 sccm
  Pressure: about 26.6 Pa (about 200 mTorr)
  High frequency power (high frequency power/low frequency power): about 1500 W/about 0 W (Reforming Process of Photoresist Film)
  Processing gas: $H_2$/He=about 300 sccm/about 500 sccm
  Pressure: about 2.66 Pa (about 20 mTorr)
  High frequency power (high frequency power/low frequency power): about 300 W/about 0 W (Trimming Process of Photoresist Film)
  Processing gas: $O_2/N_2$=about 300 sccm/about 75 sccm Pressure: about 33.3 Pa (about 250 mTorr)

High frequency power (high frequency power/low frequency power): about 500 W/about 0 W (Etching Process of Polysilicon Film)

Processing gas: $HBr/SF_6/He$=about 400 sccm/about 70 sccm/about 200 sccm

Pressure: about 6.66 Pa (about 50 mTorr)

High frequency power (high frequency power/low frequency power): about 0 W/about 500 W After performing the above-described processes plural times, a semiconductor wafer W is observed by an electron microscope, and a good step-shaped structure is found to be formed.

Further, in the above trimming process, a trimming ratio y/x is found to be about 0.7. In comparison, in a comparative example where the reforming process of the photoresist film is not performed before the trimming process, a trimming ratio y/x is found to be about 1.6. Accordingly, it is found that a trimming ratio can be greatly improved by performing the reforming process of the photoresist film as in the present experimental example. Here, as mentioned above, the gaseous mixture of a $H_2$ gas and a He gas is used as the processing gas for reforming the photoresist film. If a single gas of $H_2$ is used as the processing gas for reforming the photoresist film, a reforming effect would be so high that it may become difficult to trim the photoresist film in the trimming process. That is, by adding the He gas to the $H_2$ gas, the reforming effect on the photoresist film can be controlled to a desired level.

Moreover, in the reforming process of the photoresist film, a flow rate ratio $He/H_2$ may be controlled to be in a range of from about 0% to about 10% in consideration of the reforming effect and efficiency in trimming. Further, a pressure may be set to be in a range of from about 1.33 Pa to about 6.66 Pa (about 10 mTorr to about 50 mTorr). Although a better trimming ratio can be achieved under a higher pressure, there is a trade-off between the pressure and the roughness of the sidewall of the photoresist film. In addition, a high frequency power for plasma generation may be in a range of from about 200 W to about 500 W. Although a better trimming ratio can be achieved by applying a higher power, there is a trade-off between the power and the roughness of the sidewall of the photoresist film.

Moreover, when the above processes are performed plural times, a trimming amount in an x direction during the trimming process is found to be almost constant, e.g., about 300 nm from the first time of process to the tenth time of process. Meanwhile, in a comparative example where the deposit removing process is not performed, a trimming amount in an x direction in the first time of process is found to be about 220 nm, but the trimming amount in the tenth time of process is further decreased to about 180 nm. In view of this, it is found that by performing the deposit removing process as in the present experimental example, the trimming amount in the x direction can be increased, and, even when the process is repeated plural times, the trimming amount in the x direction can be constant.

In the above-described reforming process of the top surface of the photoresist film 200, although the gaseous mixture of the $H_2$ gas and the He gas is used as the processing gas, it may be also possible to use a gaseous mixture of $H_2$ gas, He gas and a silicon-containing gas (e.g., $SiF_4$, $SiCl_4$ or the like) as the processing gas. When such a gaseous mixture is used, it is possible to form a coating layer such as a silicate carbon layer on the surface of the photoresist as well as to reform the photoresist by the action of the $H_2$ gas. Accordingly, the trimming ratio y/x can be decreased.

Figure 4:
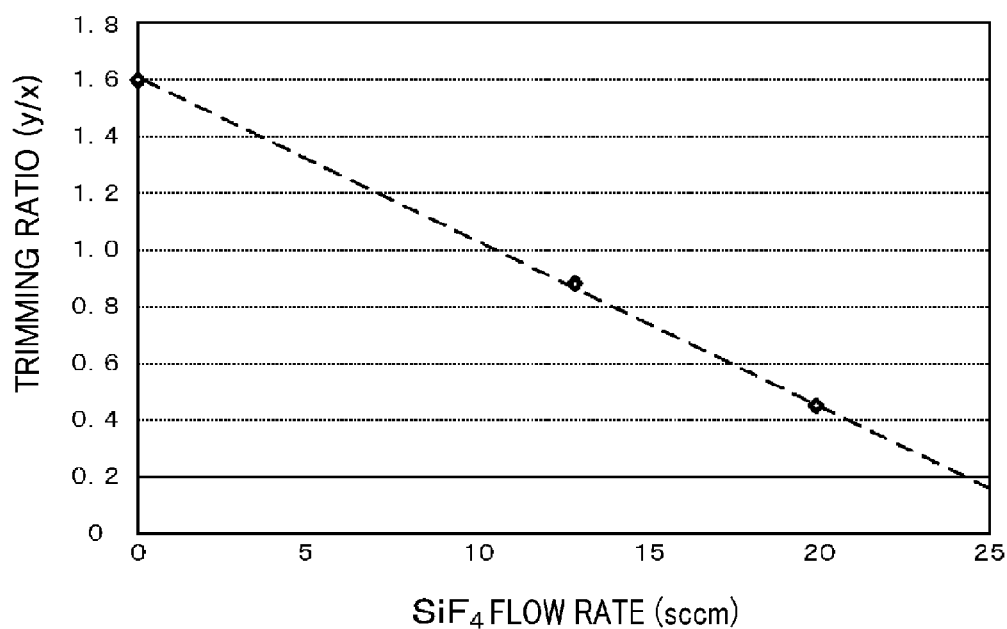
FIG. 4 is a graph showing a relationship between a flow rate of a $SiF_4$ gas and a trimming ratio.

FIG. 4 is a graph showing a result of investigating a relationship between a flow rate of $SiF_4$ and a trimming ratio y/x. In FIG. 4, a vertical axis represents the trimming ratio y/x, and a horizontal axis represents the flow rate of $SiF_4$. A reforming process of the top surface of the photoresist film 200 is performed under the following conditions.

Processing gas: $H_2/He/SiF_4$=about 100 sccm/about 700 sccm/about XX sccm

Pressure: about 20.0 Pa (about 150 mTorr)

High frequency power (high frequency power/low frequency power): about 300 W/about 300 W As depicted in the graph of FIG. 4, if the flow rate of the $SiF_4$ gas is increased from about 0 sccm to about 20 sccm, the trimming ratio is found to be decreased. Further, in order to obtain the effect of decreasing the trimming ratio, a certain amount of $SiF_4$ gas needs to be flown. Meanwhile, if the flow rate of the $SiF_4$ gas is set to be too great, the trimming ratio is decreased, and a trimming rate of the photoresist film is also reduced. As a result, a processing time for obtaining a desired trimming amount is increased. For this reason, it is desirable to set a flow rate ratio of $SiF_4$ gas to $H_2$ gas ($SiF_4$ gas flow rate/$H_2$ gas flow rate) to be within a range of from about 5% to about 30%, more desirably, within a range of from about 10% to about 20%.

Further, the above illustrative embodiment and the experimental example are described for the case of the multilayer film 210 is formed by layering, e.g., the silicon dioxide ($SiO_2$) film 201a as an insulating film and the polysilicon film (doped polysilicon film) 202a as a conductive film. However, as stated above, the illustrative embodiment and the experimental example are also applicable to a multilayer film formed by layering two kinds of films each having different permittivity, e.g., a multilayer film formed by layering a silicon dioxide film and a silicon nitride film, or a multilayer film formed by layering a polysilicon film and a doped polysilicon film.

In such cases, a deposit removing process, a reforming process of a top surface of a photoresist film, a trimming process of the photoresist film and so forth may be performed in the same manner as described above in the experimental example. Further, etching processes of the silicon dioxide film, the polysilicon film and the doped polysilicon film may be performed in the same as described above in the experimental example. An etching process of the silicon nitride film may be performed by using, e.g., a gas such as $CH_2F_2$, $CHF_3$, $CF_4$, or $CH_3F$. To be more specific, the etching process of the silicon nitride film may be performed under the following conditions.

Processing gas: $CF_4/CHF_3$=about 25 sccm/about 175 sccm

Pressure: about 16.0 Pa (about 120 mTorr)

High frequency power (high frequency power/low frequency power): about 500 W/about 200 W The present disclosure is not limited to the illustrative embodiments and experimental examples described above, and various changes and modifications may be made. By way of example, the plasma processing apparatus is not limited to a parallel plate type apparatus that applies dual high frequency powers to a lower electrode. That is, the present disclosure is applicable to various kinds of plasma processing apparatuses such as a plasma processing apparatus that respectively applies high frequency powers to an upper electrode and a lower electrode or a plasma processing apparatus that applies a single frequency power to a lower electrode.

What is claimed is:

1. A semiconductor device manufacturing method for forming a step-shaped structure in a substrate by etching the substrate having thereon a multilayer film and a photoresist film provided on the multilayer film and serving as an etching mask, the multilayer film being formed by alternately layering a first film having a first permittivity and a second film having a second permittivity different from the first permittivity, the semiconductor device manufacturing method comprising:

a first process for plasma-etching the first film by using the photoresist film as a mask;

a second process for exposing the photoresist film to hydrogen-containing plasma and forming a reforming film on a top surface of the photoresist film;

a third process for trimming the photoresist film; and a fourth process for etching the second film by using the trimmed photoresist film and the plasma-etched first film as masks, wherein the step-shaped structure is formed in the multilayer film by repeatedly performing the first process to the fourth process in this sequence.

2. The semiconductor device manufacturing method of claim 1, wherein the first film is an insulating film and the second film is a conductive film.

3. The semiconductor device manufacturing method of claim 1, wherein a combination of the first and second films is one selected from a combination of a silicon dioxide film and a doped polysilicon film, a combination of a silicon dioxide film and a silicon nitride film, and a combination of a polysilicon film and a doped polysilicon film.

4. The semiconductor device manufacturing method of claim 1, further comprising:

between the first process and the second process, a deposit removing process for removing deposits adhering to the photoresist film.

5. The semiconductor device manufacturing method of claim 1, wherein plasma of a gaseous mixture of a hydrogen gas and a helium gas is used in the second process.

6. The semiconductor device manufacturing method of claim 5, wherein plasma of a gaseous mixture of a hydrogen gas, a helium gas and a silicon-containing gas is used in the second process.

7. The semiconductor device manufacturing method of claim 5, wherein an internal pressure of a processing chamber is controlled to be about 1.33 Pa to about 6.66 Pa in the second process.

8. The semiconductor device manufacturing method of claim 1, wherein a total number of the first film and the second film which are alternately layered is equal to or larger than 64.

9. A computer-readable storage medium having stored thereon computer-executable instructions, in response to execution, cause a plasma processing apparatus to perform a semiconductor device manufacturing method as claimed in claim 1, the plasma processing apparatus comprising:

a processing chamber configured to accommodate therein a processing target substrate;

a processing gas supply unit configured to supply a processing gas into the processing chamber; and a plasma generation unit configured to generate plasma of the processing gas.

* * * * *

UNITED STATES PATENT AND TRADEMARK OFFICE
CERTIFICATE OF CORRECTION

| | | |
|---|---|---|
| PATENT NO. | : 8,735,299 B2 | Page 1 of 1 |
| APPLICATION NO. | : 13/410512 | |
| DATED | : May 27, 2014 | |
| INVENTOR(S) | : Seiichi Watanabe | |

It is certified that error appears in the above-identified patent and that said Letters Patent is hereby corrected as shown below:

In the Specification

Column 2, line 63, please add - 2 - between "table" and "so"

Signed and Sealed this
Sixteenth Day of September, 2014

Michelle K. Lee
*Deputy Director of the United States Patent and Trademark Office*